United States Patent [19]

Liberman

[11] 4,351,011
[45] Sep. 21, 1982

[54] DIRECTIONAL WAVE DETECTOR APPARATUS

[75] Inventor: Salomon Liberman, Ra'anana, Israel
[73] Assignee: ASEA Aktiebolag, Västerås, Sweden
[21] Appl. No.: 259,719
[22] Filed: May 1, 1981

Related U.S. Application Data

[63] Continuation of Ser. No. 26,366, Apr. 2, 1979, abandoned.

[30] Foreign Application Priority Data

Apr. 6, 1978 [SE] Sweden ............................ 7803868

[51] Int. Cl.³ .................... G01R 31/08; H02H 3/38
[52] U.S. Cl. ...................................... 361/82; 324/52
[58] Field of Search .................. 361/82, 84, 85, 81, 361/77; 324/52

[56] References Cited

U.S. PATENT DOCUMENTS

| | | | |
|---|---|---|---|
| 3,878,460 | 4/1975 | Nimmersjo | 361/82 |
| 4,063,166 | 12/1977 | Glavitsch | 324/52 |
| 4,079,435 | 3/1978 | Zaslavskaya | 361/82 |
| 4,100,587 | 7/1978 | Anderson | 361/82 |

FOREIGN PATENT DOCUMENTS

| | | | |
|---|---|---|---|
| 2523006 | 11/1976 | Fed. Rep. of Germany | 324/52 |
| 2531203 | 12/1976 | Fed. Rep. of Germany | 324/52 |
| 2539451 | 3/1977 | Fed. Rep. of Germany | 361/82 |

*Primary Examiner*—J. D. Miller
*Assistant Examiner*—L. C. Schroeder
*Attorney, Agent, or Firm*—Watson, Cole et al.

[57] ABSTRACT

In directional wave detector apparatus for electrical power line relay protection devices determining the direction to a fault, the current and voltage of the travelling waves generated by a fault point are combined at a measuring point and the sign of the combined signal is determined. A tripping or blocking signal is emitted depending on whether the sign of the combined signal indicates that the fault lies within or outside the range protection of the relay protection device.

8 Claims, 4 Drawing Figures

DIRECTIONAL WAVE DETECTOR APPARATUS

This is a continuation, of application Ser. No. 26,366 filed Apr. 2, 1979, now abandoned.

BACKGROUND

1. Field of the Invention

The present invention relates to directional wave detector apparatus for determining, with the help of the directin of movement of the travelling waves passing a measuring point in a power supply network, which may also comprise cables, the direction to the fault that has caused the travelling waves, and more particularly to such apparatus for determining whether the fault lies within or outside the range of protection of the relay protection device which comprises the wave detector.

2. Prior Art

When a fault occurs in a power supply network it leads to travelling waves moving along the line. It is known to use the direction of movement of such travelling waves at a measuring point to determine the direction to the location of the fault. As an example of this, reference is made to U.S. Pat. Nos. 3,878,460 and 3,956,671. A fault which occurs within the range of a power line supervised by a relay, is called a fault lying ahead. In the travelling waves which from such a fault move inwardly towards the measuring point of the relay, the current and voltage waves have different signs so that the relationship $u = -Z_o \cdot i$ is obtained, where the voltage is designated u, the current i and the wave impedance $Z_o$. If the fault appears in the opposite direction from the location of measuring, the relay senses that the voltage and current waves have the same sign and the above-mentioned relationship is changed to $u = Z_o \cdot i$. The relay then interprets the fault as a fault lying behind the measuring point.

The travelling waves which from the location of the fault move along the power line, comprise transients within a wide frequency range. It is known to filter out the stationary component of the fundamental frequency by band exclusion filters, so that only changes are sensed, and then compare the signs of the voltage and current waves, and with the guidance of the result of that comparison determine the direction to the location of fault. It is also known to exclude the filtering and compare the voltage and current waves directly.

SUMMARY OF THE INVENTION

According to the present invention a third alternative is used. Instead of treating the voltage and current waves individually, the product of voltage and current is formed, that is, the power or its integral, energy. The direction to the fault can then be determined by the sign of the instantaneous power or energy change. According to what has been stated earlier, the voltage and current travelling waves have different signs when the fault lies ahead of the measuring point, which means that the power or energy change then always has a negative sign. In case of a fault lying behind, the voltage and current travelling waves have equal signs, which means that the power or energy change always has a positive sign. The sign and amount obtained from the product formed from the voltage and the current is used, according to the invention, for indicating the direction to the source of the fault. According to the invention the problem of determining the direction of the fault is solved by using more simple circuits than in known wave detectors.

BRIEF DESCRIPTION OF THE DRAWINGS

The invention will be described by means of the accompanying drawings.

DETAILED DESCRIPTION

Figure 1A:
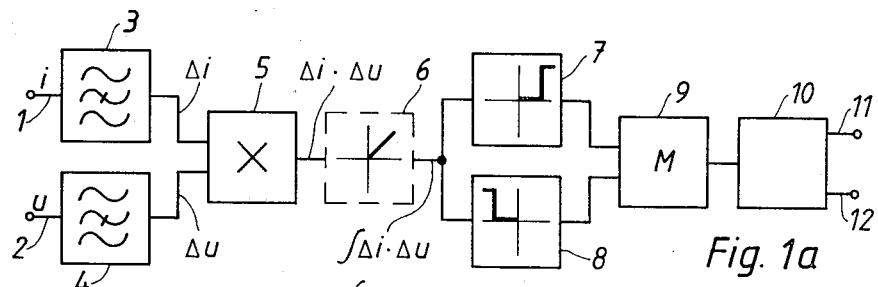
FIGS. 1a and 1b show circuit diagrams for two alternative embodiments of the inventive concept, with filtering of the fundamental frequency.
Figure 1B:
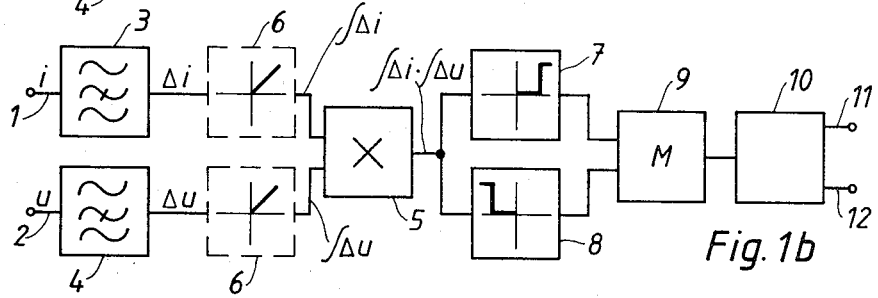

All the Figures show a single phase detector. For a normal three-phase relay protection device, three similar detectors are required, one for each phase. The detector has two inputs 1 and 2. The first input 1 is supplied with a signal i, which corresponds to the current at the measuring point. This signal may be a voltage corresponding to that current. To the second input 2 there is supplied a signal u which corresponds to the voltage at the measuring point. FIGS. 1a and 1b show that both signals are supplied to individual band exclusion filters 3, 4 for filtering out the component of the signals having the same frequency as the power supply network. According to the embodiment of the invention shown in FIG. 1a, multiplier 5 is arranged to be supplied with signals $\Delta i$ and $\Delta u$, coming from filtering circuits 3 and 4. The signal $\Delta i \cdot \Delta u$ now appears at the output of multiplier 5 and this signal is supplied to integrator 6, at the output of which the signal $\int \Delta i \cdot \Delta u$ appears. Instead of an integrator there may be used a derivative circuit. What will be used is determined, among other things, by the intended speed of operation of the arrangement. An integrating circuit gives a certain amount of smoothing and a somewhat delayed output signal, whereas a derivative circuit gives a more rapid output signal, especially in the case of strong and high-frequency transients. It is also possible to exclude such a circuit, and it is therefore drawn in dashed lines. This is repeated also in the other Figures, where the circuit 6 may be integrating, derivative or completely omitted. The output signal from integrator 6 is conducted to two level-sensing circuits arranged in parallel, one positive circuit designated 7 and one negative circuit designated 8. The outputs of the two circuits 7, 8 are each connected to an input of memory circuit 9, which is locked to the first signal arriving, whether this is positive or negative. The output of memory circuit 9 is connected to output circuit 10 having output 11 for a signal to the protection device of the opposite end of the line, which signal provides information about the direction to the last-mentioned protection device. A second output 12 is arranged to deliver a tripping signal to a circuit-breaker in case of a fault lying ahead within its own range of protection. The structure and operation of memory circuit 9 and output circuit 10 are shown and described in U.S. Pat. No. 3,956,671.

The arrangement according to FIG. 1b corresponds to that shown in FIG. 1a except that the integration takes place prior to the multiplier and with one integrator for each signal $\Delta i$ and $\Delta u$. The output signal from the multiplier in this case is therefore $= \int \Delta i \cdot \int \Delta u$.

The level-sensing circuits 7 and 8 may each be combined with an additional level-sensing circuit, which have a lower level than the two shown circuits to ensure that a disturbance, which lies below the level for the circuits 7 and 8, does not in any way effect a tripping in another protection devie after reflection in the station. This is shown and described in more detail in U.S. Pat. No. 4,053,816.

Figure 2A:
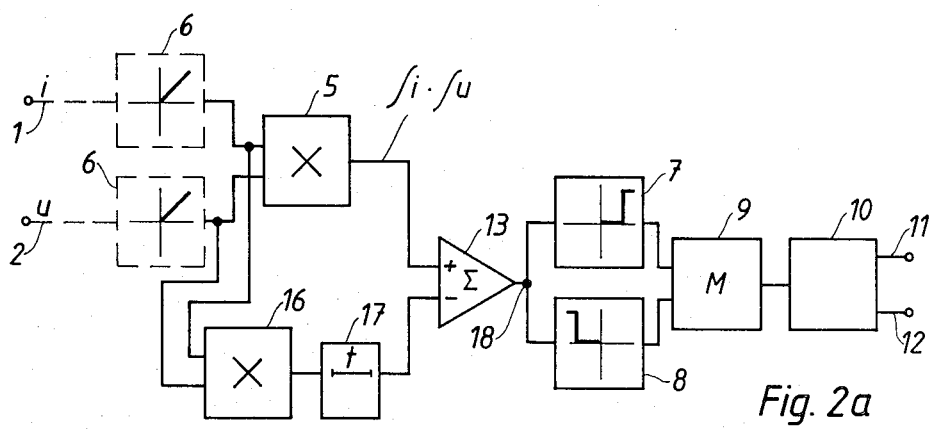
FIGS. 2a and 2b show two alternatives where the fundamental frequency is included in the signals.
Figure 2B:
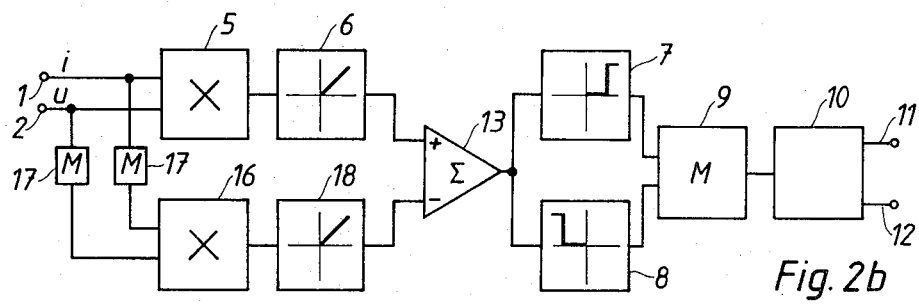

FIGS. 2a and 2b show another alternative embodiment of the wave detector, according to which the part of the signals having the same frequency as the power supply network is not filtered out but is included together with transients in the signals i and u, which are processed in the wave detector. According to FIG. 2a the signals first pass through separate integrators 6, whereafter the integrated signals are multiplied in multiplier 5 and the product thus obtained is provided to the positive input of summation device 13. The two input signals are also multiplied in multiplier 16, the output signal of which will therefore have a specified relation to the output signal from multiplier 5. The output signal from multiplier 16 is passed via memory 17 to the negative input of summation device 13. The memory is arranged in this case as a time-lag circuit, the time-lag of which is of such a magnitude that the signal received from multiplier 5, comprising the transients generated by a fault, have safely arrived at the positive input of summation device 13 before the signal from memory 17 has arrived at the negative input of summation device 13. In case of a faultless network the output signals from multipliers 5 and 16 are equal. Thus, no output signal is present at output 18 of summation device 13. If a fault occurs in the network, the signal received from multiplier 5, comprising the transients generated by the fault, will immediately differ in magnitude from the output signal of memory 17. The input signals of the summation device 13 will thus differ, resulting in a summation device output signal representing the instantaneous power or energy change. Circuits 7, 8, 9, 10 located subsequent to the summation device are identical with those shown in FIGS. 1a and 1b.

According to the alternative shown in FIG. 2b, the two signals i and u are led directly to multiplier 5 and the product signal i·u formed therein is integrated in integrator 6, the output signal of which enters the positive input of summation device 13. In a second branch the two signals i and u each pass through memory 17, acting as a time-lag circuit. After the output from the two memories, the signals are multiplied in multiplier 16 and the product signal formed thereby is supplied to the negative input of summation device 13 by integrator 18. After the summation device, circuits 7, 8, 9, 10 follow, as shown previously.

The invention is not limited only to the shown and described methods and devices for determining the direction of the fault. Other methods and arrangements for comparing different signs of current and voltage changes are also feasible. It is readily realized that, for example, a division of $\Delta u$ by $\Delta i$ produces a quotient, the sign of which could indicate the direction to the fault in the same way as the product of $\Delta u$ and $\Delta i$.

What is claimed is:

1. Directional wave detector apparatus in electrical power line relay protection devices for determining the direction to a fault from the direction of movement of travelling waves generated by a fault and passing through a measuring point in said electrical power lines, comprising:
   means for multiplying or dividing the current and voltage of at least a portion of the travelling waves to determine the sign of the product or quotient signal;
   means for recording the sign of the first appearing product or quotient; and
   means for emitting a tripping or blocking signal dependent on whether the sign of the product or quotient obtained upon multiplication or division indicates that the fault lies within or outside the range of protection of the relay, respectively.

2. Directional wave detector apparatus as in claim 1 further comprising level detector circuitry responsive to the product or quotient signal to determine the sign thereof.

3. Directional wave detector apparatus as in claim 1 or 2 further comprising means for integrating the measured voltage and current waves.

4. Directional wave detector as in claim 1 or 2 further comprising means for integrating the product or quotient signal.

5. Apparatus as in claim 1 or 2 comprising means for comparing the output of said multiplying or dividing means with the corresponding product or quotient signal output of a time delay circuit.

6. Apparatus as in claim 1 or 2 comprising means for delaying the input current and voltage input signals to a first multiplying or dividing circuit; and means for comparing the output of a second multiplying or dividing circuit with the product or quotient signal output from said first multiplying or dividing circuit.

7. Directional wave detector apparatus as in claim 1 or 2, comprising a band exclusion filter for suppressing the frequency of the power line.

8. Directional wave detector apparatus as claimed in claim 1 further comprising:
   first and second band exclusion filters for suppressing the nominal line frequency components in the current and voltage measured at said measuring point;
   said multiplying or dividing means multiplying or dividing the output signals of said first and second band exclusion filters by each other to generate said respective product or quotient signal; and
   level detector circuitry responsive to said product or quotient signal to determine the polarity thereof.

* * * * *